United States Patent
Kim et al.

(10) Patent No.: US 8,778,720 B2
(45) Date of Patent: Jul. 15, 2014

(54) LASER FIRING APPARATUS FOR HIGH EFFICIENCY SOLAR CELL AND FABRICATION METHOD THEREOF

(75) Inventors: Jong Hwan Kim, Seoul (KR); Hwa Nyeon Kim, Seoul (KR); Ju Hwan Yun, Seoul (KR)

(73) Assignee: LG Electronics Inc., Seoul (KR)

( * ) Notice: Subject to any disclaimer, the term of this patent is extended or adjusted under 35 U.S.C. 154(b) by 79 days.

(21) Appl. No.: 13/292,887

(22) Filed: Nov. 9, 2011

(65) Prior Publication Data

US 2012/0058592 A1    Mar. 8, 2012

Related U.S. Application Data

(62) Division of application No. 12/646,659, filed on Dec. 23, 2009, now abandoned.

(30) Foreign Application Priority Data

Dec. 30, 2008  (KR) .................. 10-2008-0137176

(51) Int. Cl.
*H01L 21/00* (2006.01)
(52) U.S. Cl.
USPC ............... 438/72; 438/22; 438/82; 438/98; 257/43; 257/72; 257/88; 257/E31.124
(58) Field of Classification Search
CPC . H01L 31/18; H01L 51/0068; H01L 51/0074; H01L 51/0056
USPC ........... 257/43, 72, 88, E31.124; 438/22, 72, 438/82, 85, 98, 104, 151, 166, 681
See application file for complete search history.

(56) References Cited

U.S. PATENT DOCUMENTS

| | | | |
|---|---|---|---|
| 6,423,929 B1 | 7/2002 | Muller et al. | |
| 6,888,560 B2 | 5/2005 | Jin | |
| 6,927,109 B1 | 8/2005 | Tanaka et al. | |
| 2006/0185716 A1* | 8/2006 | Murozono et al. ............ | 136/250 |
| 2007/0068570 A1* | 3/2007 | Kim et al. ...................... | 136/256 |
| 2007/0095662 A1* | 5/2007 | Suzuki ......................... | 204/424 |
| 2008/0194079 A1 | 8/2008 | Yamamoto et al. | |
| 2008/0296567 A1 | 12/2008 | Irving et al. | |
| 2009/0026970 A1* | 1/2009 | Ohtani ........................ | 315/169.3 |
| 2010/0084009 A1* | 4/2010 | Carlson et al. ................ | 136/255 |
| 2010/0267194 A1 | 10/2010 | Alemán et al. | |

FOREIGN PATENT DOCUMENTS

| | | |
|---|---|---|
| DE | 10-2006-040-352 B3 | 10/2007 |
| JP | 63-60082 A | 3/1988 |
| JP | 4-214675 A | 8/1992 |
| JP | 2001-85354 A | 3/2001 |
| JP | 2008-130590 A | 6/2008 |
| KR | 10-2003-0056248 A | 7/2003 |
| WO | WO 2006/011608 A | 2/2006 |
| WO | WO 2008/025392 A1 | 3/2008 |
| WO | WO 2008/107194 A2 | 9/2008 |

* cited by examiner

*Primary Examiner* — Mark A Laurenzi
(74) *Attorney, Agent, or Firm* — Birch, Stewart, Kolasch & Birch, LLP

(57) ABSTRACT

Discussed is a fabrication method of a solar cell according to an embodiment of the invention, which includes forming an electrode material on a semiconductor substrate for the solar cell; and forming an electrode by heat treating the electrode material by laser irradiation, wherein the electrode material comprises at least one of an electrode paste, electrode ink and aerosol for the electrode.

6 Claims, 5 Drawing Sheets

LASER FIRING APPARATUS FOR HIGH EFFICIENCY SOLAR CELL AND FABRICATION METHOD THEREOF

CROSS-REFERENCE TO RELATED APPLICATION

This application is a divisional application of co-pending U.S. application Ser. No. 12/646,659 filed on Dec. 23, 2009, now abandoned and claims priority to Korean Patent Application No. 10-2008-0137176, filed on Dec. 30, 2008, in the Korean Intellectual Property Office. The entire contents of each of these applications are hereby incorporated by reference.

BACKGROUND OF THE INVENTION

1. Field of the Invention

The embodiments of the present invention relate to a laser firing apparatus for a high efficiency solar cell, and more specifically, to a laser firing apparatus for a high efficiency solar cell including at least one laser generating unit that forms a front electrode unit by irradiating a laser to the front electrode unit formed on a front surface of a semiconductor substrate for the solar cell, and forms a back surface field (BSF) layer by irradiating a laser to a back metal paste region formed on a back surface of the semiconductor substrate, and a fabrication method thereof.

2. Description of the Related Art

Upon classifying a solar cell based on a substrate material therefor, the solar cell may be further classified largely into three types, such as a crystalline silicon based solar cell, an amorphous silicon based solar cell, and a compound semiconductor based solar cell. Further, types of the crystalline silicon based solar cell includes a single crystalline solar cell and a polycrystalline solar cell.

In a fabrication process of the silicon crystalline solar cell, a firing process performed by heating the silicon crystalline solar cell is essential. At this time, the firing process is generally performed by a method that performs heat treatment for several minutes at a high temperature by using a belt furnace. During performing of the firing process, a phenomenon occurs whereby lifetime of carriers is reduced, which has an effect on the efficiency of the solar cell. Therefore, in order to maintain the lifetime of the carriers, a study on the method that minimizes the heat treatment time of the silicon substrate is urgently needed.

SUMMARY OF THE INVENTION

The embodiments of the present invention proposes to address the problems in the related art as described above. It is an object of the present invention to provide a firing apparatus that can perform heat treatment of a solar cell within a short time.

In addition, it is another object of the present invention to provide a fabrication method of a solar cell with increased efficiency by using the firing apparatus.

In order to achieve the above and other objects, there is provided a laser firing apparatus for a solar cell according to one aspect of the present invention including at least one laser generating unit that irradiates a laser irradiation on to an electrode region formed on a semiconductor substrate for the solar cell and heat-treats the electrode region.

In another aspect, the laser irradiation is in a line form.

In another aspect, the laser irradiation is in a line form whose output light is formed by a slit.

In another aspect, the laser firing apparatus for the solar cell further includes a plurality of laser generating units disposed on a line.

In another aspect, the laser generating unit includes a first laser generating unit that is positioned to irradiate a front surface of the semiconductor substrate and a second laser generating unit that is positioned to irradiate a back surface of the semiconductor substrate, and the first laser generating unit and the second laser generating unit are disposed to be oppose each other.

In another aspect, the laser generating unit includes the first laser generating unit and the second laser generating unit that irradiate one surface of the semiconductor substrate and are disposed to be parallel with each other.

In another aspect, the laser firing apparatus for the solar cell further includes a stage that seats the semiconductor substrate.

In another aspect, the stage is at least one belt type moving unit that moves the semiconductor substrate.

In another aspect, the at least one belt type moving unit includes a first belt type moving unit and a second belt type moving unit.

In accordance with another aspect of the present invention, there is provided a fabrication method of a solar cell, including forming an electrode material on a semiconductor substrate for the solar cell; and forming an electrode by heat treating the electrode material by laser irradiation; wherein the electrode material comprising electrode paste, electrode ink and aerosol for electrode.

In another aspect, the electrode material is formed according to a front electrode pattern and is formed on the front surface of the semiconductor substrate.

In another aspect, the material for the front electrode formed according to the front electrode pattern is heat-treated at a temperature of 600° C. to 1000° C. by the laser irradiation.

In another aspect, the electrode material is formed according the back electrode pattern and is formed on the back surface of the semiconductor substrate.

In another aspect, the material for the back electrode formed according to the back electrode pattern is heat-treated at a temperature of 450° C. to 750° C. by the laser irraditation.

In another aspect, the material for the back electrode formed on the back surface of the semiconductor substrate is formed as the back electrode by heat treatment and a back surface field (BSF) layer is formed at an interface between the back surface and back electrode of the semiconductor substrate.

In another aspect, the material for the front electrode and the material for the back electrode are simultaneously fired by simultaneous laser irradiations.

In another aspect, the semiconductor substrate is heat-treated by laser irradiations.

In another aspect, the semiconductor substrate is a p type impurity semiconductor substrate or an n type impurity semiconductor substrate.

In another aspect, the fabrication method of a solar cell further comprises forming an antireflective layer on the front surface of the semiconductor substrate prior to forming the electrode material.

In another aspect, the fabrication method of a solar cell further includes forming a back passivation layer on the back surface of the semiconductor substrate prior to forming the electrode material.

The heat treatment is performed in a short time by using the laser firing apparatus of the present invention, such that the lifetime of the carriers affecting the efficiency of the solar cell can be increased as compared to the case of using the existing belt furnace.

In addition, with the fabrication method of the high efficiency solar cell according to the present invention, the solar cell with the increased efficiency can be fabricated.

BRIEF DESCRIPTION OF THE DRAWINGS

The above and other objects, features and advantages of the present invention will become apparent from the following description of example embodiments given in conjunction with the accompanying drawings, in which.

DETAILED DESCRIPTION OF THE PREFERRED EMBODIMENT

Figure 1:
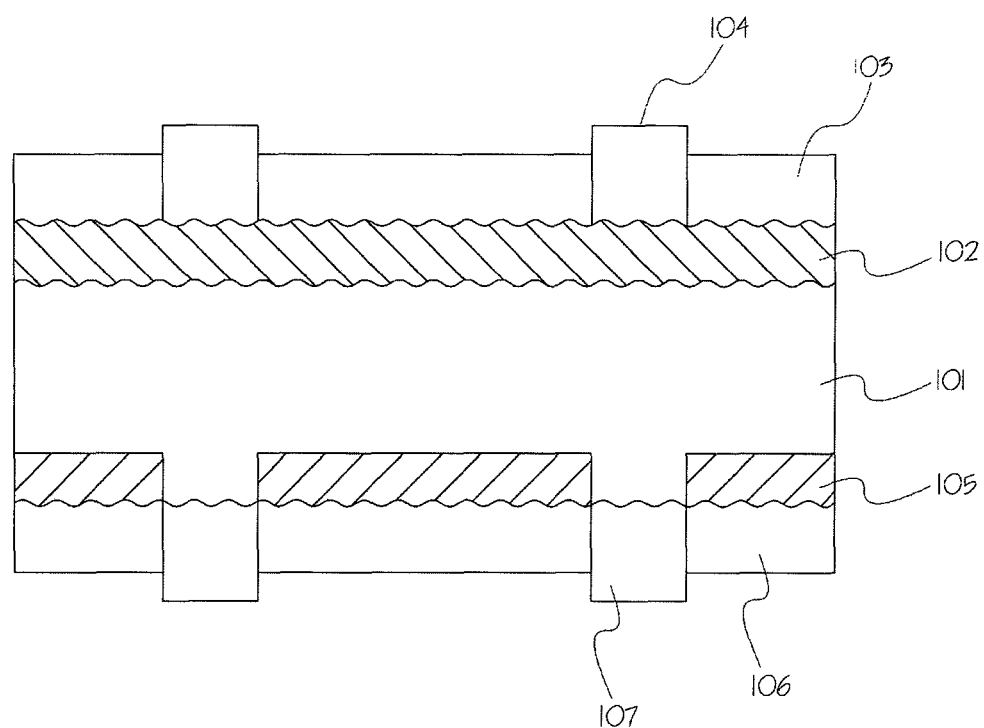
FIG. 1 is a cross-sectional view of a solar cell.

The embodiments of the present invention will now be described more fully hereinafter with reference to the accompanying drawings forming a part of this specification wherein like reference characters designate corresponding parts in the several views. In the embodiments of the present invention, detailed description of the functions and configurations that make the purport of the present invention unnecessarily obscure are omitted.

In order to more clearly describe a function of a laser firing apparatus for a solar cell according to embodiments of the present invention, a conventional fabrication method of a solar cell will be first described for contrast.

FIG. 1 is a cross-sectional view of a solar cell. Referring to FIG. 1, a conventional fabrication method of the solar cell will be briefly described below. Thereafter, the solar cell of FIG. 1 will be referred to in describing a fabrication method of the solar cell according to embodiments of the present invention.

First, an n+ layer 102 is formed by diffusing phosphorous on a front surface of a p type impurity semiconductor substrate 101 and an antireflective layer 103 is then formed on the n+ layer 102. A metal paste is subsequently screen-printed and dried on the front surface and a back surface of the substrate 101, and the substrate 101 is then heat-treated in a belt furnace.

As a result, on the front surface of the substrate, silver (Ag) contained in the metal paste passes through the antireflective layer 103 to contact the n+ layer 102, thereby forming a front electrode unit (fire-through contact) 104. In addition, on the back surface of the substrate, an Al containing paste 106 is diffused into the substrate to form a back surface field (BSF) layer 105 and form a back surface electrode unit 107 together therewith.

When performing the heat treatment to form the BSF layer 105 and electrode units 107, 107 of the solar cell according to a conventional fabrication method, the time spent on the belt furnace is about 1 to 2 minutes and the maximum temperature reached is about 800° C. In the heat treatment process according to the conventional fabrication method, a lifetime of charge carriers is suddenly reduced. If the life time is reduced, a probability of recombining holes and electrons generated by receiving light is large and thus, the efficiency of the solar cell is reduced.

Generally, when the metal paste containing the Ag disposed on the front surface and back surface of the substrate is subjected to a screen printing and drying step in a predetermined pattern, a lifetime of charge carriers corresponds to about 18 to 20 µs. However, when being subjected to the heat treatment step of the belt furnace, the lifetime is suddenly reduced to about 4 µs.

As described above, in order to prevent or reduce the phenomenon of the decreased lifetime of the charge carriers, which affects the efficiency of the solar cell due to the high-temperature heat treatment using the belt furnace, in embodiments of the present invention, the solar cell is fabricated using a laser (laser beam or laser irradiation) that can locally heat the semiconductor substrate and the heat treatment is performed within a short time.

Generally, the conversion efficiency η of the solar cell refers to a value that divides open circuit voltage Voc×short current density Jsc×fill factor (FF) by total light energy (device area S×intensity I of light irradiated to a solar cell). Therefore, in order to increase the conversion energy η of the solar cell, it is important to make the short current density Jsc and/or the open circuit voltage Voc large. One of the factors affecting the values of the short current density Jsc and/or the open circuit voltage Voc are a firing time of the solar cell.

Figure 6:
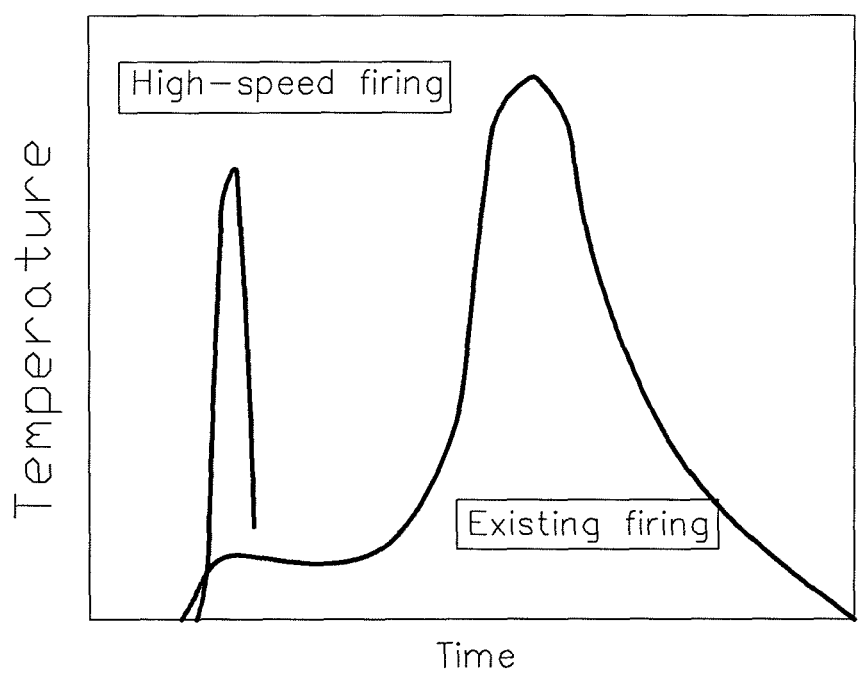
FIG. 6 is an exemplified diagram showing the time and the temperature applied according to high speed firing and existing firing.

As can be appreciated from FIG. 6, the firing process is performed at a temperature of about 800° C. during the fabrication process of the solar cell. At this time, the solar cell is fabricated by being divided into two cases, i.e., existing firing and high-speed firing. The existing firing refers to the case of firing during a relatively long time according to the existing method and the high-speed firing refers to a case of firing during a relatively shorter time as compared to the existing method.

In order to review the effect on the conversion efficiency η of the solar cell fabricated by changes in the firing time as described above, the short current density Jsc and the open circuit voltage Voc are measured. The measured results are shown in FIG. 7.

Figure 7:
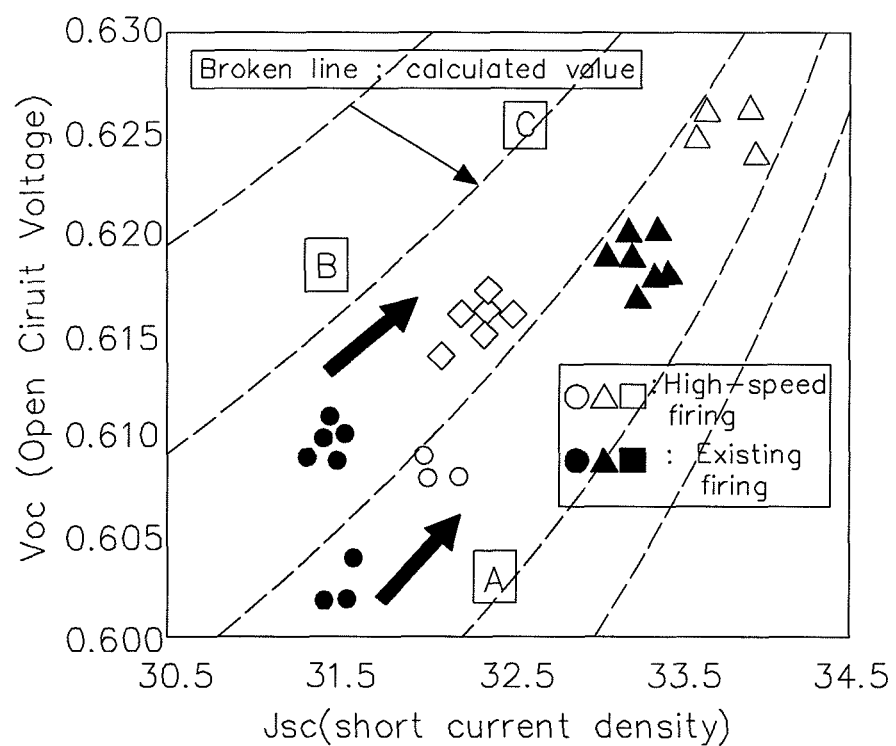
FIG. 7 is an exemplified diagram showing the measurement of the short current density ($J_{sc}$) and the open circuit voltage ($V_{oc}$) according to high speed firing-Solar cell and existing firing-Solar cell.

As can be appreciated from FIG. 7, the high-speed firing of the solar cell obtains the short current density Jsc and the open circuit voltage Voc, all of which have a higher value than the existing firing of the solar cell. In other words, in order to obtain the solar cell having the high conversion efficiency η, a need exists for the fabrication method of the solar cell by the high-speed firing.

Therefore, a fabrication method of the solar cell by the high-speed firing using a laser (a laser beam or a laser irradiation) by the laser firing apparatus for the high efficiency solar cell according to one embodiment of the present invention will be described with reference to FIG. 2.

Figure 2:
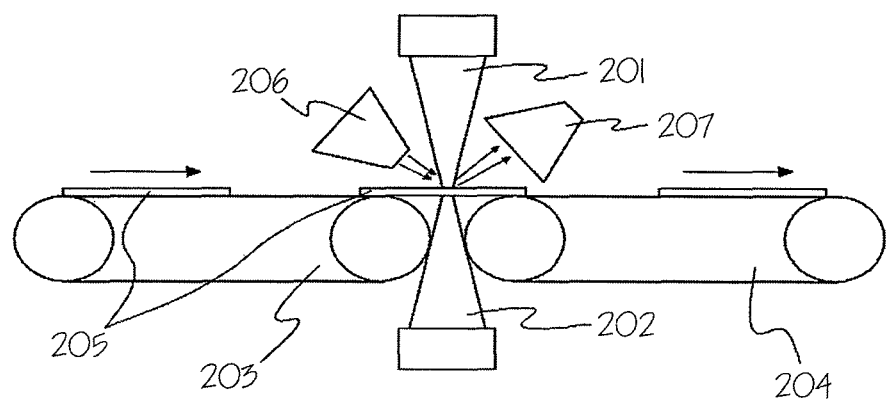
FIG. 2 is an exemplified diagram of a laser firing apparatus of a solar cell that includes a first laser generating unit and a second laser generating unit according to one embodiment of the present invention.

The laser firing apparatus for the solar cell of FIG. 2 includes a first laser generating unit 201, a second laser generating unit 202, a first belt type moving unit 203, and a second belt type moving unit 204. As shown in FIG. 2, the first belt type moving unit 203 and the second belt type moving unit 204 are disposed to be separated by a predetermined distance to allow a laser (a laser beam or a laser irradiation) generated in the second laser generating unit 202 to pass between the first and second belt type moving units 203 and 204 where they are separated.

First, an n+ layer is formed on a front surface of a semiconductor substrate 205, and the semiconductor substrate 205 for the solar cell, on which a back metal paste region is formed on a back surface of the substrate, is seated on the first belt type moving unit 203. The embodiment uses a p type impurity semiconductor substrate, but is not limited thereto. Therefore, the embodiment can also use an n type impurity semiconductor substrate.

The semiconductor substrate 205 for the solar cell seated on the first belt type moving unit 203 is irradiated by a first laser (a first laser beam or a first laser irradiation) and a second laser (a second laser beam or a second laser irradiation) while moving to the second belt type moving unit 204. The first laser is generated in a line form in the first laser generating unit 201 and the temperature of the semiconductor substrate 205 for the solar cell irradiated by the first laser reaches a temperature range of 600 to 1000° C. The first laser is irradiated on the front electrode unit of the semiconductor substrate 205 for the solar cell to fire and allow the front electrode unit to contact the n+ layer.

In addition, the second laser is generated in a line form in the second laser generating unit 202 and the temperature of the semiconductor substrate for the solar cell irradiated by the second laser reaches a temperature range of 450 to 750° C. The second laser is irradiated on the back metal paste region of the semiconductor substrate for the solar cell, thereby forming a back surface field (BSF) layer. The line form of output light of the first and/or second laser may be formed by a slit, for example, the slit containing panel.

As such, according to the embodiment of the present invention, only the front electrode unit and/or the back metal paste region of the semiconductor substrate for the solar cell are locally heated by at least one laser in a line form and heat-treated in a short time, thereby making it possible to increase (maintain or not reduce) the lifetime of the carriers. As described above, when the lifetime is increased (maintained or not reduced), a probability of recombining holes and electrons is reduced, thereby making it possible to fabricate the solar cell with the increased efficiency.

When the lifetime is about 4 µs upon fabricating the solar cell through the heat treatment process of the belt furnace by the existing method, the theoretical maximum Jsc value, that is verified by computer simulation, is only 92%. However, when fabricating the solar cell using the laser firing apparatus for the high efficiency solar cell, the lifetime is 10 µs or more and the theoretical maximum Jsc value, which is verified by computer simulation, can reach up to 97% Jsc or more, thereby making it possible to fabricate the solar cell with the increased efficiency.

The laser firing apparatus for the solar cell may further include a blowing system 206 and/or an evacuation system 207. The blowing system 206 plays a role of blowing air, in order to discharge a fume generated when a laser is irradiated on the front electrode unit away from the solar cell. In addition, the evacuation system 207 plays a role of absorbing or sucking the fume, in order to discharge the fume away from the solar cell quickly.

As shown in FIG. 2, in the fabrication method of the solar cell according to one embodiment of the present invention, the first laser generating unit 201 is positioned to irradiate the front surface of the semiconductor substrate and the second laser generating unit 202 is positioned to irradiate the back surface of the semiconductor substrate for the high efficiency solar cell, such that they may be disposed to be opposed to each other.

However, the positions of the first laser generating unit 201 and the second laser generating unit 202 are not necessarily limited to the above-mentioned positions. In other words, the first laser generating unit 201 and the second laser generating unit 202 may be arranged on a line. Both the first laser generating unit 201 and the second laser generating unit 202 may be positioned to irradiate the front surface of the semiconductor substrate 101 or the back surface of the semiconductor substrate 101, such that they may be disposed in parallel with each other.

Figure 3:
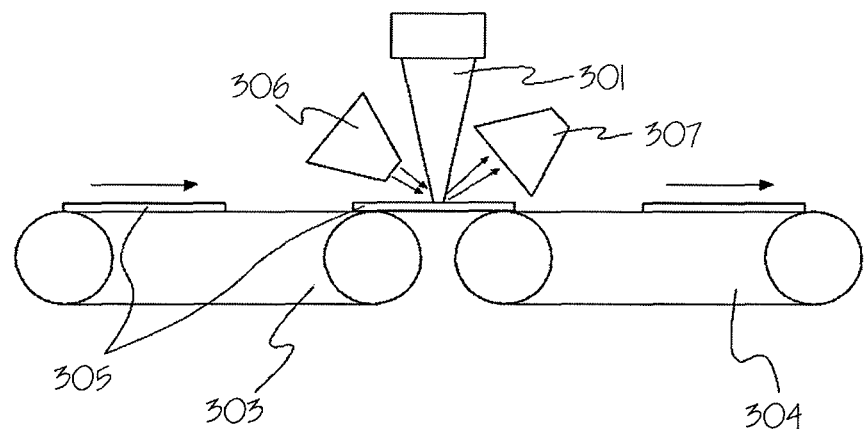
FIG. 3 is an exemplified diagram of a laser firing apparatus of a solar cell that includes one laser generating unit according to one embodiment of the present invention.

In addition, in the above-mentioned embodiment, the laser irradiated to the front electrode unit and the back metal paste region is irradiated from separate laser generating units, that is, the first laser generating unit and the second laser generating unit, respectively, but is not limited thereto. In other words, as can be appreciated from FIG. 3, the laser irradiated to the front electrode unit and the back metal paste region may be generated from the same laser generating unit 301.

When the laser irradiated to the front electrode unit and the back metal paste region is generated from the same laser generating unit 301, a P type semiconductor impurity substrate 305 may be moved by the belt type moving unit at least twice in the firing process of the front electrode unit and the process of forming the BSF layer respectively in order to fabricate the high efficiency solar cell.

Figure 4:
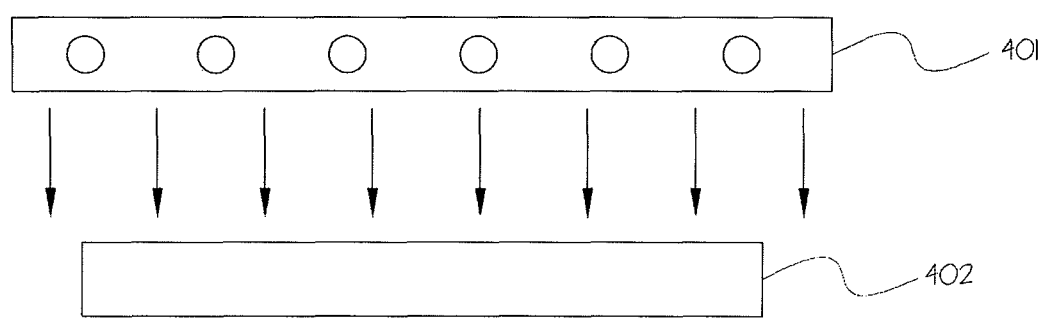
FIG. 4 is an exemplified diagram showing a laser in a line form according to one embodiment of the present invention.
Figure 5:
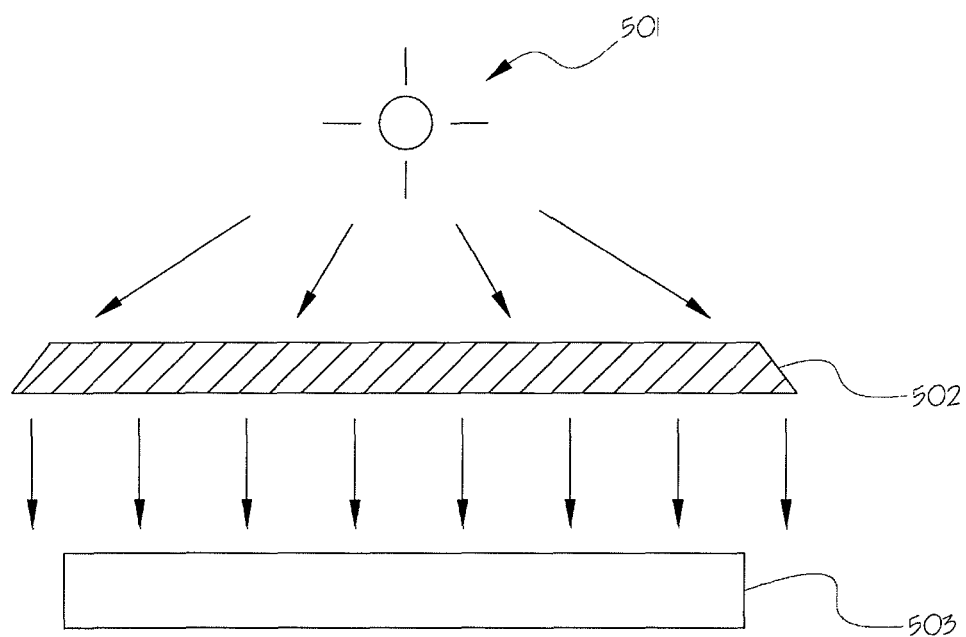
FIG. 5 is an exemplified diagram showing a laser in a line form whose output light is formed by a slit according to one embodiment of the present invention.

FIG. 4 is an exemplified diagram showing a laser in a line form according to one embodiment of the present invention and FIG. 5 is an exemplified diagram showing a laser in a line form whose output light is formed by a slit according to one embodiment of the present invention.

FIG. 4 shows a plurality of laser generating units 401 that are arranged along a line to irradiate a plurality of lasers in a line form, and FIG. 5 shows a laser generated by one laser generating unit 501 irradiates the laser in a line form, whose output light is formed (or guided) by a slit 502, on a semiconductor substrate 503.

According to another embodiment of the present invention, a fabrication method of a solar cell in another form by the laser firing apparatus for the high efficiency solar cell will be described. In other words, referring to FIG. 2, a fabrication method of a solar cell including the front electrode unit and the rear electrode unit using the laser firing apparatus for the high efficiency solar cell according to the present invention will be described.

First, an antireflective layer is formed on an upper portion of the front surface of the p type impurity semiconductor substrate. Thereafter, the n+ layer and the front metal paste region are sequentially formed, and the back passivation layer is formed on the upper portion of the back surface of the substrate. Then, the semiconductor substrate for the solar cell, on which the back metal paste region is formed, is seated on the first belt type moving unit. The present embodiment uses the p type impurity semiconductor substrate, but is not limited thereto. Therefore, the present embodiment can also use the n type impurity semiconductor substrate.

The semiconductor substrate for the solar cell seated on the first belt type moving unit is irradiated by the first laser and the second laser while moving to the second belt type moving unit. The first laser, which is generated in a line form by the first laser generating unit, is irradiated on the front electrode unit of the semiconductor substrate for the solar cell to fire and allow the front electrode unit to contact the n+ layer. In addition, the second laser, which is generated in a line form by the second laser generating unit, is irradiated on the back metal paste region and back electrode unit of the semiconductor substrate for the solar cell to form the back surface field (BSF) layer to fire and allow the back electrode unit to contact the semiconductor substrate. The laser in a line form whose output light is formed by a slit may be used.

The laser firing apparatus for the solar cell further includes a blowing system or an evacuation system and when a laser is irradiated, can rapidly discharge a fume occurring in the semiconductor substrate away from the solar cell.

By being subject to the above processes, the fabrication of the solar cell where the antireflective layer and the front electrode unit are formed on the semiconductor substrate and the back surface field (BSF) layer, the back passivation layer, and the back electrode unit are sequentially formed is completed.

In one embodiment, the laser formed by the first laser generating unit and the laser formed by the second laser generating unit are simultaneously irradiated, thereby simultaneously forming the front electrode unit and back electrode unit of the solar cell. However, the laser generated from the first laser generating unit and the laser generated from the second laser generating unit need not be irradiated at the same time. Thus, they may be irradiated at different times such that the front electrode unit and back electrode unit of the solar cell are not simultaneously formed.

In addition, in one embodiment, the first laser generating unit and the second laser generating unit are disposed at a position opposite to each other, but are not limited to the position. In other words, the first laser generating unit and the second laser generating unit are arranged on a line such that the laser generated from the first laser generating unit and the laser generated from the second laser generating unit are irradiated at different times, and the front electrode unit and back electrode unit of the solar cell are not simultaneously fired.

Although the present invention has been described in detail with reference to example embodiments, it will be understood by those skilled in the art that various modifications and equivalents can be made without departing from the spirit and scope of the present invention, as set forth in the appended claims. Also, the substances of each constituent features explained in the specification can be easily selected and processed by those skilled in the art from the well-known various substances. Also, those skilled in the art can remove a part of the constituent features as described in the specification without deterioration of performance or can add constituent features for improving the performance. Furthermore, those skilled in the art can change the order to methodic steps explained in the specification according to environments of processes or equipments. Thus, it is intended that embodiments of the present invention cover the modifications and variations of this invention provided they come within the scope of the appended claims and their equivalents.

What is claimed is:

1. A fabrication method of a solar cell, the method comprising:
    forming an electrode material on a semiconductor substrate for the solar cell; and
    forming an electrode by heat treating the electrode material by laser irradiation,
    wherein the electrode material comprises at least one of electrode paste, electrode ink and aerosol for electrode,
    wherein the electrode material comprises a front electrode material being formed according to a front electrode pattern and being formed on the front surface of the semiconductor substrate, and a back electrode material being formed according to a back electrode pattern and being formed on the back surface of the semiconductor substrate, and
    wherein the front electrode material and the back electrode material are simultaneously fired by simultaneous laser irradiations.

2. The fabrication method of the solar cell according to claim 1, wherein the semiconductor substrate is heat-treated by the laser irradiations.

3. The fabrication method of the solar cell according to claim 1, wherein the semiconductor substrate is a p type impurity semiconductor substrate or an n type impurity semiconductor substrate.

4. The fabrication method of the solar cell according to claim 1, further comprising forming an antireflective layer on the front surface of the semiconductor substrate prior to forming the electrode material.

5. The fabrication method of the solar cell according to claim 1, further comprising fondling a back passivation layer on the back surface of the semiconductor substrate prior to forming the electrode material.

6. The fabrication method of the solar cell according to claim 1, wherein the back electrode material for a back electrode formed on the back surface of the semiconductor substrate is diffused into the semiconductor substrate by heat treatment to form a back surface field (BSF) layer at an interface between the back surface and the back electrode of the semiconductor substrate.

* * * * *